United States Patent
Eberler et al.

(10) Patent No.: US 8,054,228 B2
(45) Date of Patent: Nov. 8, 2011

(54) ANTENNA STRUCTURE FOR A MAGNETIC RESONANCE DEVICE

(75) Inventors: Ludwig Eberler, Postbauer-Heng (DE); Wolfgang Renz, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 327 days.

(21) Appl. No.: 12/487,728

(22) Filed: Jun. 19, 2009

(65) Prior Publication Data
US 2009/0315784 A1    Dec. 24, 2009

(30) Foreign Application Priority Data
Jun. 20, 2008 (DE) .......................... 10 2008 029 373

(51) Int. Cl.
*H01Q 1/26* (2006.01)
(52) U.S. Cl. ........................................ 343/701; 343/741
(58) Field of Classification Search .................. 343/701, 343/741, 742, 866, 867
See application file for complete search history.

(56) References Cited

U.S. PATENT DOCUMENTS

| | | | |
|---|---|---|---|
| 6,221,094 B1 | 4/2001 | Bare | |
| 2009/0189952 A1* | 7/2009 | Lee et al. | 347/45 |
| 2009/0304553 A1* | 12/2009 | Gordon | 422/105 |
| 2010/0187413 A1* | 7/2010 | DiFoggio et al. | 250/269.1 |

* cited by examiner

*Primary Examiner* — Hoanganh Le
(74) *Attorney, Agent, or Firm* — Schiff Hardin LLP

(57) ABSTRACT

An antenna structure for a magnetic resonance device constructed as a radiating or transmitting antenna of the magnetic resonance device, has a non-metallic antenna conductor containing a discharge gas. When energy is imparted to the discharge gas, the antenna conductor forms an electrically conducting gas discharge column and can be used as an electrically conducting antenna element.

6 Claims, 3 Drawing Sheets

ANTENNA STRUCTURE FOR A MAGNETIC RESONANCE DEVICE

BACKGROUND OF THE INVENTION

1. Field of the Invention

The invention relates to an antenna structure for a magnetic resonance of the type suitable for use in a radiating (transmitting) antenna.

2. Description of the Prior Art

An antenna arrangement of a magnetic resonance device is formed by resonant circuits. Each resonant circuit exhibits, along with metallic conductors, also capacitive elements, which form an antenna structure.

In the case of a magnetic resonance device, a number of antenna structures are arranged in the closest possible space, so that individual antenna structures are mutually influenced by coupling and magnetic field shifts or offsets.

In order to mitigate the coupling, in each case non-required, inactive antenna structures are detuned by activating active or passive detuning circuits.

In addition it is possible to provide metallic decoupling devices with the antenna structures which on the basis of their spatial location and on the basis of their shaping minimize the coupling between the respective antenna structures.

These measures are expensive in development and in construction and ultimately lead to only a minimization of the coupling effects.

However, even ideally detuned antenna structures continue to cause magnetic field displacement (shifting or offset).

In addition, in each metallic antenna structure, in particular in the case of high field systems numerous spurious resonances that cannot be detuned are present, which, e.g. in the case of spectroscopy operation, can be interfering.

SUMMARY OF THE INVENTION

An object of the present invention is to provide improved antenna structures for magnetic resonance devices which allow an improved decoupling and which exhibit only a slight influence of the magnetic field distributions.

The invention relates to an antenna structure for a magnetic resonance device in which case the antenna structure is constructed as a sending or transmitting antenna of the magnetic resonance device. The antenna structure exhibits a non-metallic antenna conductor which contains a discharge gas.

When energy is imparted to (acts on) the discharge gas, the antenna conductor forms an electrically conducting gas discharge column—a gas discharge plasma—and can hence be used as an electrically conducting antenna element.

The energy that acts on the discharge gas is provided by an ignition unit so that a discharge is ignited and maintained by further supply of energy.

The discharge gas is preferably formed as a columnar or loop-shaped gas volume.

For example, electric and/or magnetic fields can be used for ignition and maintenance of the gas discharge.

The gas volume is in the process determined by pressure (typically several millibars) and by the gas type that is used, comparable to a neon tube.

When the gas discharge plasma is ignited by exposure to energy, the antenna element is active and can be used as a field transducer, preferably as a transmitting antenna.

When the energy acting on the gas discharge plasma is removed, the discharge is extinguished and only the non-metallically formed exterior antenna structure remains, which contains the gas. Therefore any action on neighboring antenna structures is omitted, so that along with the coupling also the magnetic field distribution is optimized.

Thus, the present inventive arrangement, antenna structures are not only detuned, but rather are in the non-active state with regard to their conducting structure effectively removed from the antenna arrangement of the magnetic resonance device.

With the help of the inventive antenna structure it is possible to make non-required transmitting antennas completely ineffective. This is particularly advantageous in the case of so-called transmit arrays, which exhibit many individual transmitting antennas.

One function of such antenna structures was recently discovered and is described more closely for example in the publication "Science Daily" of Nov. 19, 2007 in the laboratory experiment.

DESCRIPTION OF THE PREFERRED EMBODIMENTS

Figure 1:
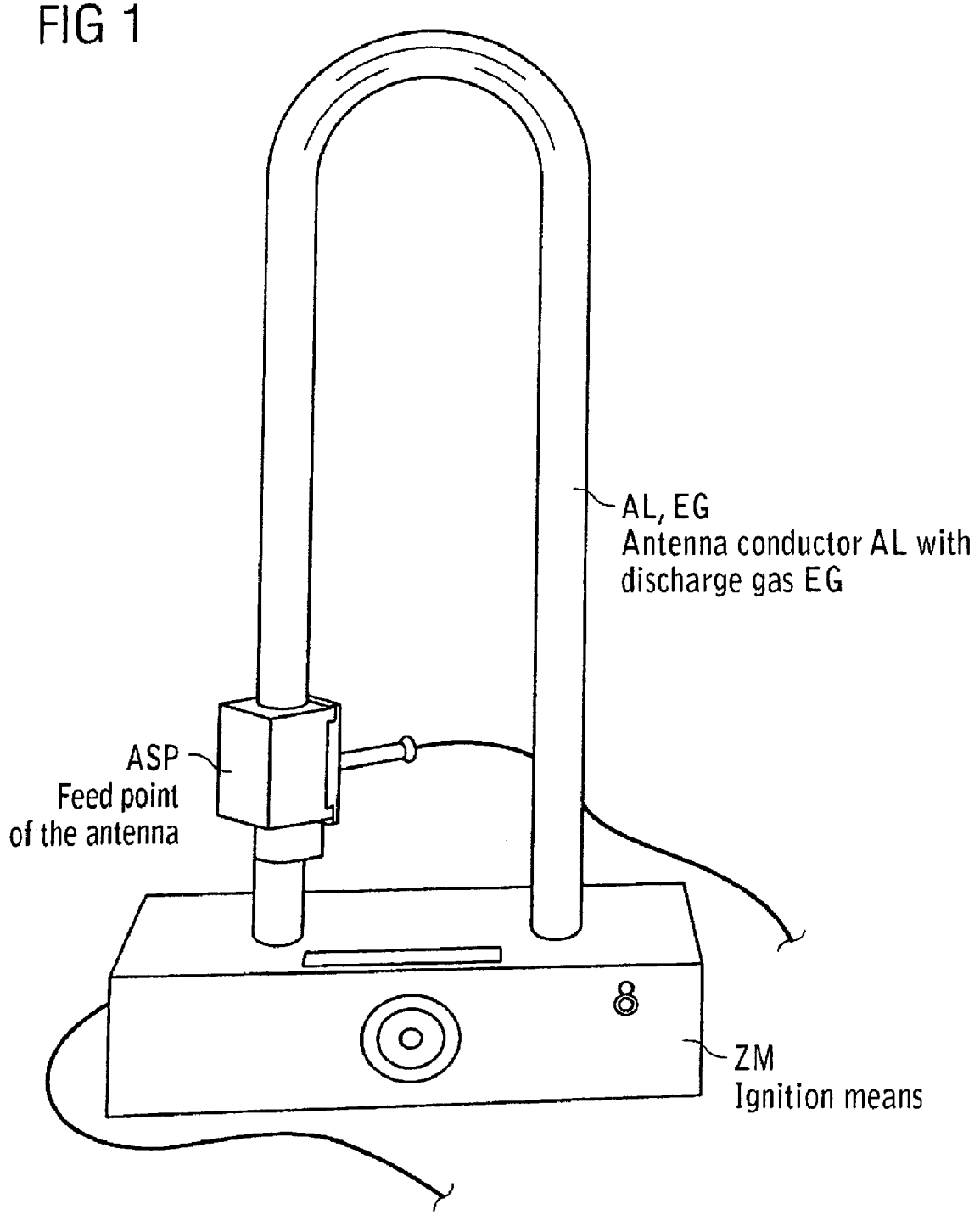
FIG. 1 shows an inventive antenna structure.

FIG. 1 shows the inventive antenna structure. A non-metallic antenna conductor AL contains a discharge gas EG. The discharge gas EG is transformed into an electrically conducting gas discharge column by an exposure to energy which takes place with the help of an ignition means ZM on the discharge gas EG. As a result it can be used as an electrically conducting antenna element so that a signal can be transmitted or received via an antenna feed point ASP.

Figure 2:
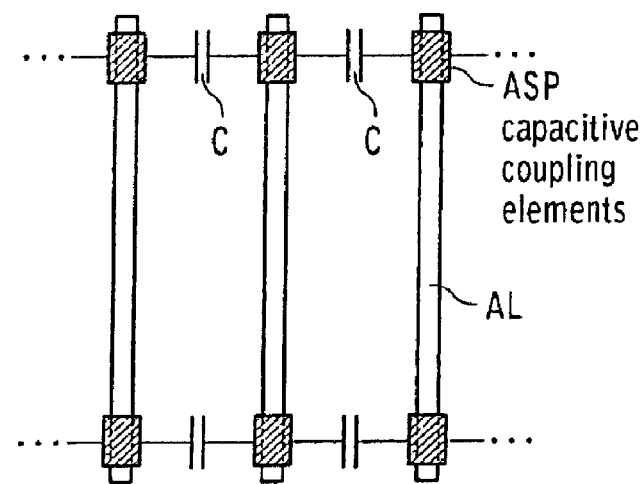
FIG. 2 shows a use of the inventive antenna structure in the case of a bird cage antenna.

FIG. 2 shows a use of the inventive antenna structure with a bird cage antenna.

Here a number of rod-shaped antenna conductors AL are connected to an end ring structure ERS via capacitors C.

Depending on the size of the capacitor values in the end ring structure and the size of the coupling elements used as antenna feed points ASP a high pass or low pass or band pass bird cage can be realized.

Figure 3:
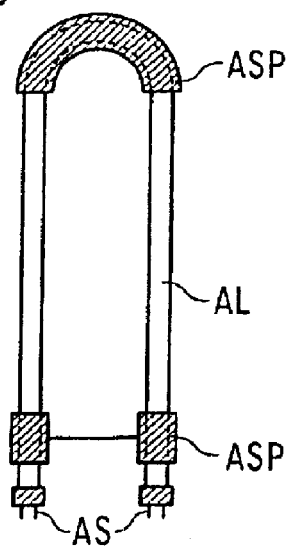
FIG. 3 shows an alternative antenna structure for use with a bird cage antenna.

FIG. 3 shows an alternative antenna structure for use with a bird cage antenna.

The antenna structure is formed here as a U-shaped antenna conductor and exhibits at its bottom end two terminals AS for the ignition element to be connected. On the upper and lower ends feed points ASP additionally formed as coupling elements are provided.

Figure 4:
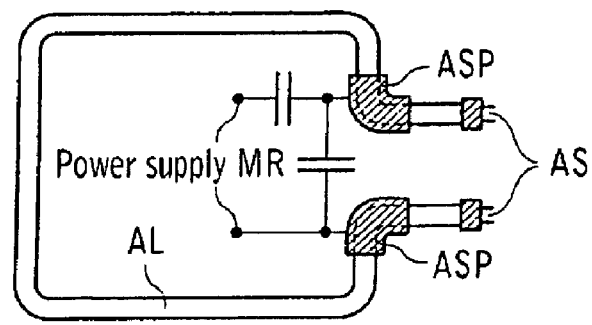
FIG. 4 shows the inventive antenna structure for use as a loop antenna.

FIG. 4 shows the inventive antenna structure for use as a loop antenna with feed points ASP and with terminals AS for the ignition element.

Figure 5:
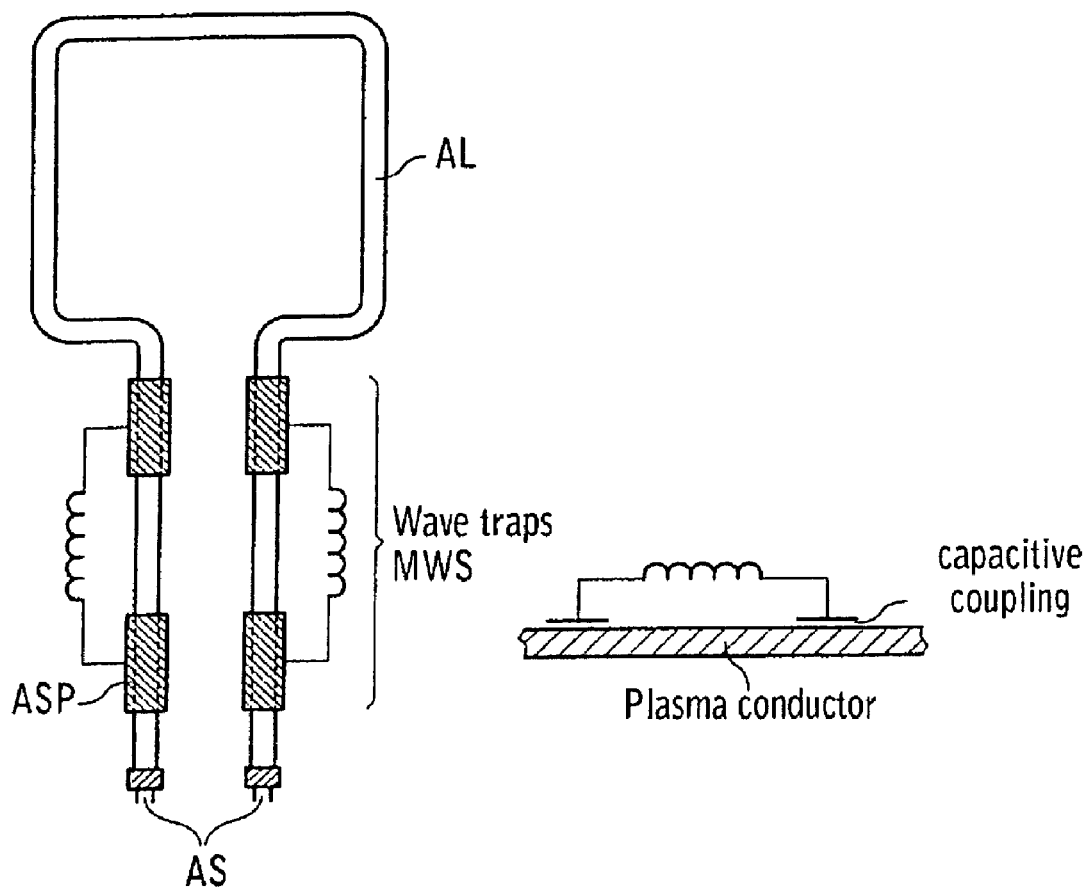
FIG. 5 shows an advantageous updated version of the loop antenna described in FIG. 4.

FIG. 5 shows an advantageous updated version of the loop antenna described in FIG. 4.

Here advantageously the feed points ASP for the high-frequency signal to the terminals AS for the ignition element are blocked. This can take place with the use of capacitively coupled baluns MWS.

The balun MWS exhibits wave traps with two capacitively coupled elements that are tuned for resonance via an inductor.

Figure 6:
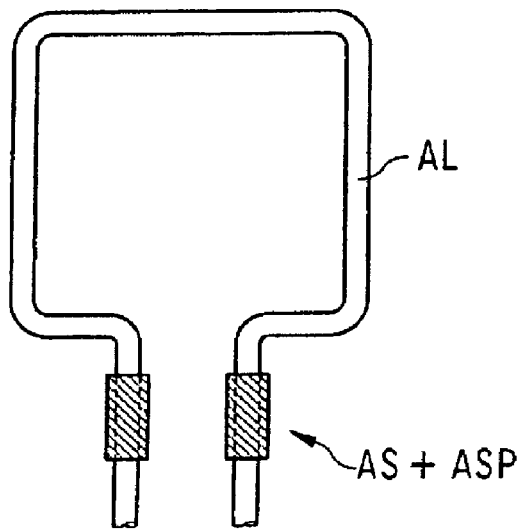
FIG. 6 shows an advantageous updated version of the loop antenna described in FIG. 4 and FIG. 5.

FIG. 6 shows an advantageous updated version of the loop antenna described in FIG. 4 and FIG. 5.

Here the terminals AS for the ignition element and the feed points ASP for the high-frequency signal are combined.

Not shown in detail in FIG. 5 and FIG. 6 are elements which make the antenna structure resonant in the case of the magnetic resonance frequency as well as the respective feed circuits.

As an alternative to the blocking of the high-frequency signals with the help of baluns MWS shown in FIG. 5 a blocking can also be achieved by a corresponding electric filter at the terminals AS of the ignition element. This filter allows the ignition energy or power supply for the gas discharge to pass, however blocks magnetic resonance useful signal portions.

Although modifications and changes may be suggested by those skilled in the art, it is the intention of the inventors to embody within the patent warranted hereon all changes and modifications as reasonably and properly come within the scope of their contribution to the art.

We claim as our invention:

1. An antenna structure for a magnetic resonance apparatus, comprising:
   a non-metallic antenna housing configured with a shape to form a radiating antenna in a magnetic resonance examination;
   a discharge gas contained in said non-metallic antenna housing; and
   an energy imparting device that imparts energy to said discharge gas in said non-metallic antenna housing that causes said discharge gas to form an electrically conducting gas discharge column in said non-metallic antenna housing, forming an electrically conducting antenna element during said magnetic resonance examination.

2. An antenna structure as claimed in claim 1 wherein said energy imparting device comprises an ignition device that interacts with said discharge gas to supply energy to said discharge gas.

3. An antenna structure as claimed in claim 1 wherein said non-metallic antenna housing shapes said discharge gas therein to form an elongated gas volume.

4. An antenna structure as claimed in claim 3 wherein said energy imparting device is an ignition device that generates a field, selected from the group consisting of an electric field and a magnetic field, that interacts with said discharge gas to form said elongated gas volume.

5. An antenna structure as claimed in claim 1 wherein said non-metallic antenna housing is connected at one end thereof with said energy imparting device to form a non-conducting structure.

6. An antenna structure as claimed in claim 1 comprising terminals connected to said non-metallic antenna housing, and a separator circuit connected to said terminals that separates energy of magnetic resonance signals supplied via said energy imparting device.

* * * * *